United States Patent
Watkins et al.

(10) Patent No.: US 8,420,415 B2
(45) Date of Patent: Apr. 16, 2013

(54) METHOD FOR FORMING A LIGHT CONVERSION MATERIAL

(75) Inventors: Charles M. Watkins, Eagle, ID (US);
Kevin Tetz, Brentwood, TN (US);
Thomas Gehrke, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 189 days.

(21) Appl. No.: 12/716,014

(22) Filed: Mar. 2, 2010

(65) Prior Publication Data
US 2011/0217800 A1    Sep. 8, 2011

(51) Int. Cl.
*H01L 21/00*    (2006.01)

(52) U.S. Cl. .................................. 438/27; 257/E21.502

(58) Field of Classification Search .................. None
See application file for complete search history.

(56) References Cited

U.S. PATENT DOCUMENTS

| | | | |
|---|---|---|---|
| 5,959,316 A | 9/1999 | Lowery | |
| 6,635,363 B1 | 10/2003 | Duclos et al. | |
| 7,108,386 B2 | 9/2006 | Jacobson et al. | |
| 7,256,057 B2 | 8/2007 | Schardt et al. | |
| 7,327,078 B2 | 2/2008 | Setlur et al. | |
| 2006/0012298 A1 | 1/2006 | Lee et al. | |
| 2009/0001399 A1 | 1/2009 | Diana et al. | |
| 2009/0001869 A1 | 1/2009 | Tanimoto et al. | |
| 2009/0014736 A1 | 1/2009 | Ibbetson et al. | |
| 2009/0295265 A1 | 12/2009 | Tabuchi et al. | |

FOREIGN PATENT DOCUMENTS

| | | |
|---|---|---|
| JP | 2007059864 A | 3/2007 |
| KR | 20080055549 A | 6/2008 |
| WO | WO-2009037848 A1 | 3/2009 |

OTHER PUBLICATIONS

Feezell, D.F. et al., Development of Nonpolar and Semipolar InGaN/GaN Visible Light-Emitting Diodes, MRS Bulletin, vol. 34, pp. 318-323, May 2009.

International Search Report and Written Opinion for International Application No. PCT/US2011/026712, mailed Oct. 31, 2011, 7 pages.

*Primary Examiner* — Seahvosh Nikmanesh
(74) *Attorney, Agent, or Firm* — Perkins Coie LLP

(57) ABSTRACT

A method and system for manufacturing a light conversion structure for a light emitting diode (LED) is disclosed. The method includes forming a transparent, thermally insulating cover over an LED chip. The method also includes dispensing a conversion material onto the cover to form a conversion coating on the cover, and encapsulating the LED, the silicone cover, and the conversion coating within an encapsulant. Additional covers and conversion coatings can be added.

32 Claims, 2 Drawing Sheets

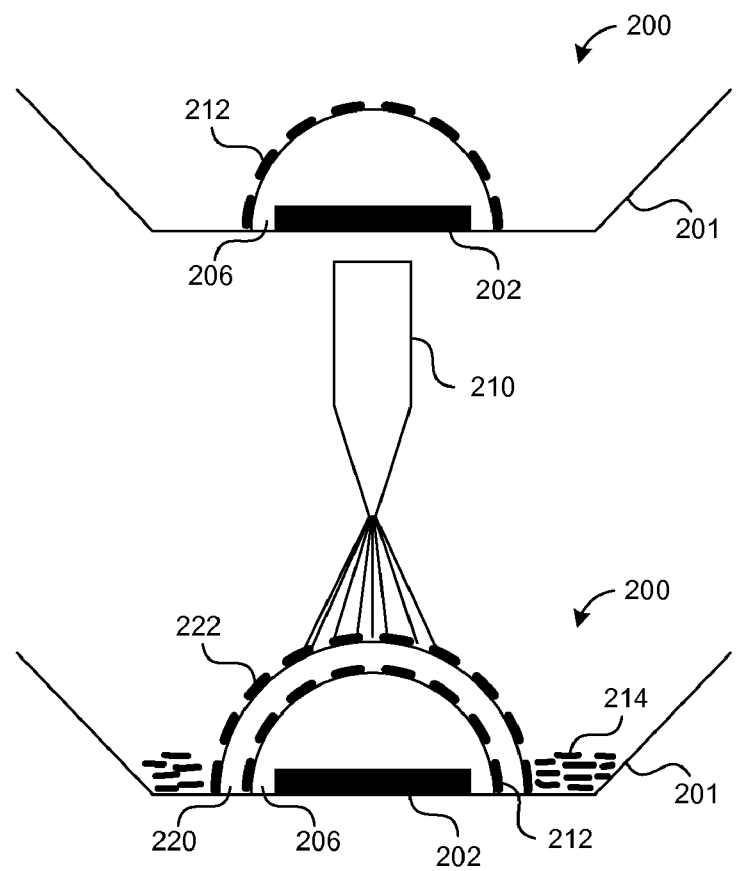
*FIG. 2A*
*FIG. 2B*
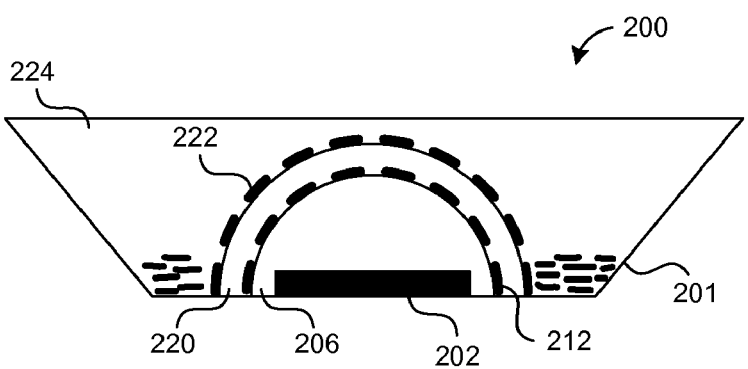
*FIG. 2C*

METHOD FOR FORMING A LIGHT CONVERSION MATERIAL

TECHNICAL FIELD

The present disclosure is related to a method and apparatus for forming a light conversion material for use with a light emitting diode (LED) or other light source.

BACKGROUND

LEDs are an efficient source of bright light for use in computer monitors, televisions, cellphones, and many other lighting applications including architectural, outdoor, commercial, and residential lighting. LEDs typically only emit light at one particular wavelength. For human eyes to perceive the color white, a mixture of wavelengths is needed. One conventional technique for emulating white light with LEDs includes depositing a conversion material (e.g., a phosphor) on an InGaN base material. In operation, the InGaN base material emits light in the visible blue spectrum that stimulates the conversion material to emit light in the yellow spectrum. The combination of the blue and yellow emissions appear white to human eyes if matched appropriately. If not matched appropriately, however, the combined emissions appear off white and reduce color fidelity of electronic devices. Accordingly, several improvements in color matching/correction may be desirable.

Conventional methods for constructing the LED and phosphor material include coating an LED with a slurry of phosphor and a carrier such as silicone. Other methods create a separate phosphor material, spaced apart from the LED, also made from a phosphor and silicone slurry. For example, U.S. Pat. No. 5,959,316 to Lowery discloses a semiconductor device with an LED and a transparent spacer that separates the LED from a uniformly thick fluorescent material. The conventional methods suffer from many difficulties. For example, phosphor particles tend to settle in a slurry, which changes the density and therefore the coverage uniformity of the phosphor material. Also, heat from the LED can reduce the efficiency of the phosphor material.

BRIEF DESCRIPTION OF THE DRAWINGS

FIG. 2A is a partially schematic, cross-sectional view of an LED with a first conversion coating according to several embodiments of the new technology.

FIG. 2B is a partially schematic, cross-sectional view of an LED with first and second conversion coatings according to several embodiments of the new technology.

FIG. 2C is a partially schematic, cross-sectional view of an LED with first and second conversion coatings encased within an encapsulant according to several embodiments of the new technology.

DETAILED DESCRIPTION

Specific details of several embodiments of the new technology are described below with reference to light emitting diodes (LEDs) and light conversion materials including phosphor materials, and associated methods of manufacturing LED assemblies. The term "phosphor" generally refers to a material that can sustain glowing after exposure to energized particles (e.g., electrons and/or photons). A person skilled in the relevant art will understand that the new technology may have additional embodiments and that the new technology may be practiced without several of the details of the embodiments described below with references to FIGS. 1A-2C.

In several embodiments of the new technology, a method for forming a light conversion assembly is disclosed. The method includes forming a cover over an LED, and dispensing a conversion material onto the cover to form a conversion coating on the cover. The method also includes encapsulating the LED, the cover, and the conversion coating within an encapsulant. The cover can be a silicone dome (e.g., partial sphere, ellipsoid or other shape), and the conversion material can be a phosphor or combination of phosphors. The method also includes encapsulating the LED, the cover, and the conversion material within an encapsulant. In other embodiments, the method includes constructing a semiconductor LED, placing the LED in a package comprising a reflective cup, and forming a first silicone cover over the LED. The method also includes forming a first conversion coating on at least a portion of the first silicone cover, forming a second silicone cover over at least a portion of the first conversion coating, and forming a second conversion coating over at least a portion of the second silicone cover. The method continues by covering the second conversion coating with an encapsulant. Any number of additional covers and conversion coatings can be used. The phosphor in the conversion coatings can be similar to or different from conversion materials used in other conversion coatings.

Figure 1A:
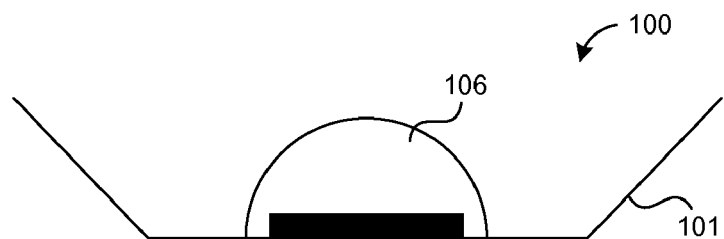
FIG. 1A is a partially schematic, cross-sectional view of an LED according to several embodiments of the new technology.

FIG. 1A is a partially schematic cross-sectional view of a semiconductor LED assembly 100 in accordance with an embodiment of the new technology. At this stage of the fabrication process, the LED assembly 100 can include a reflector cup 101, an LED chip 102 mounted to the reflector cup 101, and a cover 106 over the LED chip 102. The LED chip 102 is generally singulated from a wafer before being mounted to the reflector cup 101. The reflector cup 101 can have a flat bottom and an annular, cone shaped portion; however, other cup shapes can be used. The reflector cup can be a depression in a component of the assembly 100. The LED chip 102 can be a semiconductor LED chip 102 having one or more gallium nitride structures, indium gallium nitride structures, or structures made from other materials formed on a semiconductor wafer. For example, individual LED chips 102 can include bond pads or other terminals (not shown), circuitry (not shown) electrically coupled to the terminals, and a number of different layers that produce light. One technique for forming InGaN LEDs can include sequentially depositing N-doped GaN, InGaN, and P-doped GaN materials on a sapphire ($Al_2O_3$) and/or silicon (Si) substrate via epitaxial growth in a metal organic chemical vapor deposition (MOCVD) process. In other embodiments, however, other suitable techniques may be used to form the LED chips 102.

The cover 106 can comprise a clear material that is suitably transmissive to light (e.g., radiation in the visible spectrum) to allow light to pass through the cover 106 without affecting or altering characteristics of the light outside of acceptable ranges. For example, the cover 106 can be made from a transparent silicone material. The cover 106 can have a partially spherical shape, such as a hemisphere, or the cover 106 can have a flat, elliptical, or other shape that at least partially covers the LED chip 102.

Figure 1B:
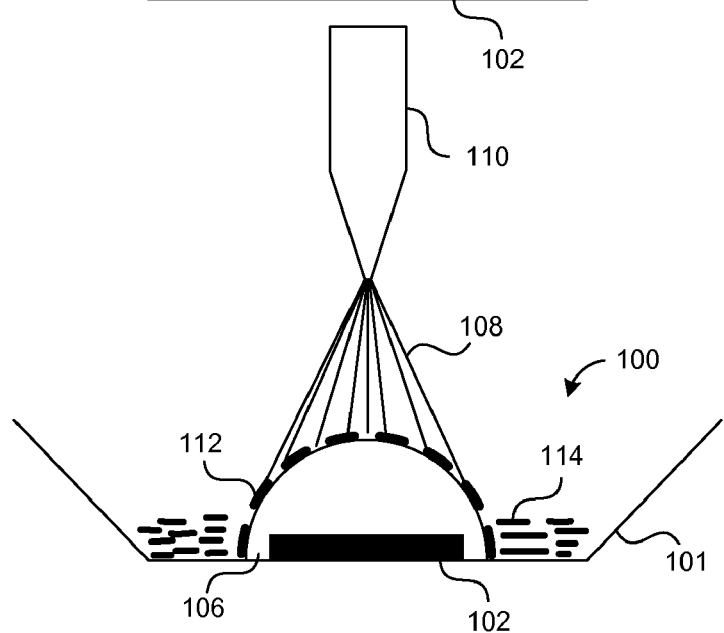
FIG. 1B is a partially schematic, cross-sectional view of an LED with a conversion coating according to several embodiments of the new technology.

FIG. 1B is a partially schematic cross-sectional view of the semiconductor LED assembly 100 at a later processing stage in which the semiconductor LED assembly 100 further includes a conversion coating 112 formed on and/or in the cover 106. The conversion coating 112 can be formed by dispensing a conversion material 108 in loose form from a nozzle 110 onto a surface of the cover 106. The conversion material 108 may be sprayed or otherwise dispensed onto the surface of the cover 106. In some embodiments, the cover 106 is a wet silicone, such as an uncured, and/or b-staged silicone material, and the conversion material 108 is a powdered phosphor that adheres to the wet silicone to create a phosphor conversion coating 112 on the cover 106. The thickness and concentration of the conversion coating 112 can be controlled by choosing different materials for the conversion material 108 or the cover 106, and/or by altering the application method.

The nozzle 110 can dispense the conversion material 108 under high pressure in a stream of pressurized fluid so that a portion of the conversion material 108 embeds into a region of the cover 106 (e.g., analogous to bead blasting processes). In other embodiments, the conversion material 108 can be dispensed with less force, such as by simply contacting the conversion material 108 to the cover 106 when the cover is wet or otherwise capable of adhering or absorbing the conversion material 108. This can be a self-limiting process where only a limited amount of conversion material 108 adheres to the cover 106 based on the properties of the cover 106, and excess conversion material 114 collects in the reflector cup 101. The excess conversion material 114 can be recycled. In still other embodiments, the conversion material 108 can be dispensed into a cloud in a chamber such that the conversion material 108 contacts the cover 106 (analogous to a vapor deposition process). In yet other embodiments, the conversion material 108 can be mixed with a solvent and/or binder into a liquid mixture that is sprayed, dipped, spin coated or otherwise deposited onto the cover 106 to form the coating 112. The liquid mixture can include an evaporating material, such as a volatile organic compound, that evaporates leaving the conversion material 108 on the cover 106 to form the conversion coating 112. In still other embodiments, the LED assembly 100 can have an adhesive material applied to the cover 106, and the conversion material 108 can be applied to the adhesive material to form the conversion coating 112. In selected embodiments the conversion coating 112 is distributed uniformly across the cover 106, but in other embodiments the conversion coating 112 can have an uneven or patterned distribution.

The light conversion material 108 can have a composition that emits at a desired wavelength when stimulated. For example, in one embodiment, the light conversion material 108 can include a phosphor containing Cerium(III)-doped Yttrium Aluminum Garnet (Ce:YAG or YAG:Ce) at a particular concentration. Such a material can emit a broad range of colors from green to yellow and to red under photoluminescence. In other embodiments, the light conversion material 108 can include Neodymium-doped YAG, Neodymium-Chromium double-doped YAG, Erbium-doped YAG, Ytterbium-doped YAG, Neodymium-cerium double-doped YAG, Holmium-chromium-thulium triple-doped YAG, Thulium-doped YAG, Chromium(IV)-doped YAG, Dysprosium-doped YAG, Samarium-doped YAG, Terbium-doped YAG, and/or other suitable phosphor compositions. In addition, $Eu^{2+}$ phosphors can be used. The following are $Eu^{2+}$ phosphors that can be used with the present technology: CaS:Eu, $CaAlSiN_3$:Eu, $Sr_2Si_5N_8$:Eu, SrS:Eu, $Ba_2Si_5N_8$:Eu, $Sr_2SiO_4$:Eu, $SrSi_2N_2O_2$:Eu, $SrGa_2S_4$:Eu, $SrAl_2O_4$:Eu, $Ba_2SiO_4$:Eu, $Sr_4Al_{14}O_{25}$:Eu, $SrSiAl_2O_3N$:Eu, $BaMgAl_{10}O_{17}$:Eu, $Sr_2P_2O_7$:Eu, $BaSO_4$:Eu, and $SrB_4O_7$:Eu. The foregoing list of light conversion materials is not exhaustive. The phosphor material may also be mixed in a suitable carrier material (epoxy, silicone, etc.).

Figure 1C:
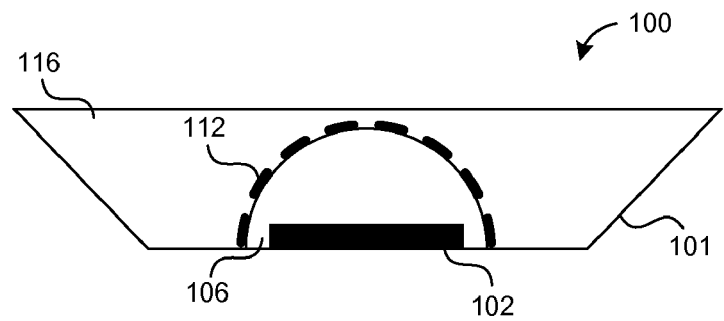
FIG. 1C is a partially schematic, cross-sectional view of an LED with a conversion coating and an encapsulant according to several embodiments of the new technology.

FIG. 1C illustrates a partially schematic cross-sectional view of the LED assembly 100 further including an encapsulant 116 that encases the cover 106 and the coating 112. When the cover 106 is wet or uncured, it can be cured or otherwise finished before depositing the encapsulant 116. The encapsulant 116 can be silicone or another suitably transparent and robust material. In some embodiments, the encapsulant material 116 does not alter the optical characteristics of light outside of an acceptable range, but in other embodiments the encapsulant 116 can modulate the radiation as desired.

Several embodiments of the LED assembly 100 overcome the problems of settling of the conversion material that affect the performance of conventional designs that use a phosphor slurry. Phosphor slurries are a liquid mixture with phosphor particles, and as such the phosphor particles can agglomerate or otherwise settle under gravitational, ionic or other forces. In contrast, several embodiments disclosed herein include forming a b-staged or other partially cured cover without a conversion material, and then dispensing the conversion material 108 onto the surface of the partially cured cover 106. This process accordingly closely controls the thickness and concentration of the conversion material 108 across the cover 106. Eliminating phosphor settling yields a more consistent, uniform distribution of conversion material 108 throughout the coating 112, which enhances the consistency and uniformity of the light produced by the phosphor coating 112. The cover 106 can also provide a thermal insulator between the LED 102 and the phosphor coating 112 that improves the efficiency of the phosphor coating 112.

FIG. 2A is a partially schematic illustration of an LED assembly 200 in accordance with another embodiment of the present technology. The LED assembly 200 can have a reflector cup 201, an LED chip 202 in the reflector cup 201, a cover 206 over the LED chip 202, and at least one conversion coating 212. These components of the LED assembly 200 generally correspond to similar components 101, 102, 106 and 112, respectively, shown and described with respect to FIGS. 1A-1C. The LED assembly 200 further includes at least one additional cover 220. Each cover 206, 220 can have a corresponding conversion coating. For example, the LED assembly 200 can include a first conversion coating 212 over the first cover 206, and a second conversion coating 222 over the second cover 220. The LED assembly 200 can also include an encapsulant 224 formed over the covers 206, 220 and over the first and second conversion coatings 212, 222. Any suitable number of covers and conversion coatings can be used.

In selected embodiments, after forming the first conversion coating 212 on the first cover 206 (and curing or otherwise finishing the first cover 206, if necessary), the second cover 220 is formed over the first conversion coating 212 and the first cover 206. According to some embodiments, the second cover 220 can be made using substantially the same materials and processes as the first cover 206. In other embodiments, the second cover 220 is made from a different material and/or process. For example, due to the structural relationship between the first cover 206 and the second cover 220, light from the LED chip 202 reaches the first cover 206 before reaching corresponding areas of the second cover 220. A portion of the energy in the light is therefore dissipated or shielded from the second cover 220. The first cover 206 is accordingly exposed to more light energy and thus more susceptible to overheating than the second cover 220. Accordingly, the first cover 206 can be made of a more heat-resistant and/or heat-insulating material than the second cover 220.

The conversion material in the second conversion coating 222 can complement the conversion material in the first coating 212. The conversion coatings 212, 222 can include a phosphor material, or any other material that emits light of a desired frequency when illuminated by light and/or other energy. In some embodiments, the first conversion coating 212 can include a first conversion material having a lower energy than a second conversion material in the second conversion coating 222. The second conversion coating 222 can be applied to the second cover 220 using any of the methods described with reference to FIG. 1, including using a nozzle 210 that dispenses a powdered conversion material onto the second cover 220, and collecting and recycling excess conversion material 214.

In some embodiments, the shape of the two covers 206, 220 is the same (e.g., the surfaces of the coverings parallel each other at corresponding tangents), with the second cover 220 having slightly larger dimensions to account for including at least a portion of the first cover 206. In other embodiments, the shapes of the two covers 206, 220 can be different, and any of the covers 206, 220 can be flat, sloped, rounded, partially spherical, hemispherical, etc. The encapsulant 224 can encase the LED chip 202, at least a portion of the reflector cup 201, the first and second covers 206, 220, and the first and second conversion coatings 212, 222, as shown in FIG. 2C. This encapsulant 224 can be generally similar to the encapsulant 116 shown and described above with respect to FIG. 1C. In some embodiments, additional covers can be made over the second cover 220 and second conversion coating 222 by a similar process, which can be repeated as many times as necessary to produce an LED construction with multiple covers to achieve the desired light quality.

From the foregoing, it will be appreciated that specific embodiments of the invention have been described herein for purposes of illustration, but well-known structures and functions have not been shown or described in detail to avoid unnecessarily obscuring the description of the embodiments of the invention. Where the context permits, singular or plural terms may also include the plural or singular term, respectively. Unless the word "or" is associated with an express clause indicating that the word should be limited to mean only a single item exclusive from the other items in reference to a list of two or more items, then the use of "or" in such a list shall be interpreted as including (a) any single item in the list, (b) all of the items in the list, or (c) any combination of the items in the list.

Also, it will be appreciated that specific embodiments described above are for purposes of illustration and that various modifications may be made without deviating from the invention. Aspects of the disclosure described in the context of particular embodiments may be combined or eliminated in other embodiments. Further, while advantages associated with certain embodiments of the disclosure may have been described in the context of those embodiments, other embodiments may also exhibit such advantages, but not all embodiments need necessarily exhibit such advantages to fall within the scope of the disclosure. Accordingly, the present invention is not limited to the embodiments described above, which were provided for ease of understanding; rather, the invention includes any and all other embodiments defined by the claims.

We claim:

1. A method for forming a light conversion assembly, comprising:
   forming a cover over a light emitting diode (LED) chip;
   dispensing a conversion material onto the cover to form a conversion coating on and/or in the cover, wherein the cover has an exposed surface, and wherein a first portion of the conversion material is embedded in the cover; and
   encapsulating the LED, the cover, and the conversion coating within an encapsulant.

2. The method of claim 1 wherein forming the cover over the LED comprises forming an uncured silicone material over the LED.

3. The method of claim 1 wherein forming the cover over the LED comprises forming a b-staged silicone material over the LED.

4. The method of claim 1 wherein the cover comprises uncured silicone material, the method further comprising curing the uncured silicone material before encapsulating the LED.

5. The method of claim 1 wherein dispensing the conversion material onto the cover comprises discharging a phosphor powder onto the cover such that a portion of the phosphor powder is embedded into a thin layer of the cover.

6. The method of claim 1, further comprising applying an adhesive to the cover and dispensing the conversion material onto the adhesive.

7. The method of claim 1 wherein dispensing conversion material onto the cover comprises dispensing a material including at least a conversion material and an evaporating carrier, and wherein the evaporating carrier evaporates such that the conversion material remains on the cover.

8. The method of claim 1 wherein dispensing the conversion material onto the cover comprises placing the LED in a chamber and dispensing the conversion material in the chamber.

9. The method of claim 8, further comprising recycling excess conversion material.

10. The method of claim 1 wherein the conversion material complements a frequency of light produced by the LED such that light that leaves the conversion coating is substantially white light.

11. The method of claim 1 wherein the cover forms a dome over the LED.

12. The method of claim 11 wherein the dome is generally hemispherical.

13. The method of claim 1 wherein a portion of the cover is generally flat and positioned generally over the LED.

14. A method for forming a light conversion assembly, comprising:
   forming a cover over a light emitting diode (LED) chip;
   dispensing a conversion material onto the cover to form a conversion coating on and/or in the cover;
   encapsulating the LED, the cover, and the conversion coatinf within an encapsulant;
      wherein forming the cover comprises forming a first cover, and wherein dispensing conversion material onto the cover comprises forming a first conversion coating on the first cover;
   forming a second cover over at least a portion of the first conversion coating; and
   forming a second conversion coating on the second cover before encapsulating the LED, the first and second covers, and the first and second conversion coatings within the encapsulant.

15. The method of claim 14, further comprising forming a plurality of covers and conversion coatings in series over the first and second cover and conversion coating.

16. The method of claim 14 wherein the first and second covers have generally similar exterior shapes.

17. The method of claim 14 wherein the first and second conversion coatings emit light at one or more frequencies that produce substantially white light.

18. The method of claim 14 wherein the first conversion coating has a first energy level and the second conversion coating has a second energy level greater than the first energy level.

19. A method for constructing a conversion lens over a semiconductor light emitting diode (LED), comprising:
constructing a semiconductor LED;
placing the LED in a package comprising a reflective cup;
forming a first silicone cover over the LED;
forming a first conversion coating on at least a portion of the first silicone cover;
forming a second silicone cover over at least a portion of the first conversion coating;
forming a second conversion coating over at least a portion of the second silicone cover; and
cover the second conversion coating with an encapsulant layer positioned in the reflective cup.

20. The method of claim 19 wherein at least one of the first and second silicone covers is made from an uncured silicone material, and wherein forming the corresponding first or second conversion coatings comprises contacting the uncured silicone material with a conversion material such that a portion of the conversion material is at least partially absorbed by the uncured silicone material.

21. The method of claim 19 wherein the first silicone cover comprises a generally flat surface positioned generally over the LED and the second silicone cover comprises a generally flat surface positioned generally over the LED.

22. The method of claim 19 wherein at least one of the first and second silicone covers comprises a dome-shaped cover positioned generally over the LED.

23. The method of claim 19 wherein forming the first and second conversion coatings comprises spraying a conversion material into a thin layer of the first and second silicone covers, respectively.

24. The method of claim 19 wherein the first conversion coating includes a first phosphor material and the second conversion coating includes a second phosphor material, and wherein the first and the second phosphor materials complement a frequency of light emitted by the LED such that light emitted from the encapsulant has a predetermined frequency.

25. The method of claim 24 wherein the predetermined frequency comprises a frequency for white light.

26. The method of claim 19 wherein the reflector cup comprises a flat bottom section and angled sidewalls.

27. The method of claim 19 wherein the reflector cup comprises a depression in the package.

28. The method of claim 19 wherein at least one of the first and second silicone covers comprises a thermal insulator configured to inhibit heat transfer between the LED and the conversion coating.

29. A method for forming a light conversion assembly, comprising:
forming a cover over a light emitting diode (LED) chip, wherein forming the cover over the LED comprises forming an uncured silicone material over the LED;
dispensing a conversion material onto the cover to form a conversion coating on and/or in the cover, wherein dispensing the conversion material comprises dispensing over the uncured silicone material; and
encapsulating the LED, the cover, and the conversion coating with an encapsulant.

30. The method of claim 29 further comprising curing the uncured silicone material before encapsulating the LED.

31. The method of claim 29 wherein dispensing the conversion material onto the cover comprises discharging a phosphor powder onto the cover such that a portion of the phosphor powder is embedded into a thin layer of the cover.

32. The method of claim 29 wherein the cover has an exposed surface, and wherein a first portion of the conversion material is absorbed by the exposed surface of the cover.

* * * * *

UNITED STATES PATENT AND TRADEMARK OFFICE
CERTIFICATE OF CORRECTION

PATENT NO. : 8,420,415 B2
APPLICATION NO. : 12/716014
DATED : April 16, 2013
INVENTOR(S) : Charles M. Watkins et al.

It is certified that error appears in the above-identified patent and that said Letters Patent is hereby corrected as shown below:

In the Claims:

In column 6, lines 56-57, in Claim 14, delete "coatinf" and insert -- coating --, therefor.

Signed and Sealed this
Eighteenth Day of June, 2013

Teresa Stanek Rea
*Acting Director of the United States Patent and Trademark Office*